United States Patent [19]

Petrizio et al.

[11] 4,267,527
[45] May 12, 1981

[54] RELAXATION OSCILLATOR

[75] Inventors: Cesare J. Petrizio, Flanders, N.J.; Robert H. Isham, Wilkes Barre, Pa.

[73] Assignee: RCA Corporation, New York, N.Y.

[21] Appl. No.: 38,210

[22] Filed: May 11, 1979

[51] Int. Cl.³ .............................................. H03K 3/35
[52] U.S. Cl. ..................................... 331/111; 331/143
[58] Field of Search ............... 331/111, 107; 307/247, 307/252, 274; 315/209 SC

[56] References Cited

U.S. PATENT DOCUMENTS

| | | | |
|---|---|---|---|
| 3,184,665 | 5/1965 | Wright | 331/111 |
| 3,202,935 | 8/1965 | Maluda | 331/109 |
| 3,206,696 | 9/1965 | Wright | 331/107 |
| 3,287,662 | 11/1966 | Walker | 331/111 |
| 3,553,495 | 1/1971 | Shaugnessy | 331/111 |

Primary Examiner—David K. Moore
Attorney, Agent, or Firm—E. M. Whitacre; P. J. Rasmussen; J. M. O'Meara

[57] ABSTRACT

Power consumption is substantially reduced and constant frequency is substantially derived without regulating the supply voltage for an oscillator circuit of the type wherein a capacitor is recurrently charged to a threshold voltage from the supply voltage and is then discharged through a gate turn-off (GTO) device. A reference voltage level proportional to the supply voltage is applied at the control electrode of the GTO device and positive current is applied at that control electrode when the differential between the charge voltage level and the reference voltage level reaches a positive trigger level, while negative current is applied thereat when that differential reaches a negative trigger level.

6 Claims, 3 Drawing Figures

RELAXATION OSCILLATOR

The present invention relates to an oscillator circuit of the type wherein a capacitor is recurrently charged from a D.C. supply voltage and then discharged through a gate turn-off (GTO) device upon reaching a threshold voltage thereacross. GTO devices typically include four alternate layers of P and N type semiconductive material with the outer layers being anode and cathode regions respectively, while the inner layer closer to the cathode region is a gate region to which current of opposite polarities is applied in controlling conduction between the anode and cathode regions. Such devices are commonly known as switchable rectifiers, transwitches, and gate controlled switches.

Although relaxation oscillators of this type are well known in the art, such oscillators consume significant amounts of power beyond what is delivered to a load. Furthermore, the frequency of such oscillators often varies with fluctuations in the D.C. supply voltage, so that additional circuitry must be utilized to regulate the D.C. supply voltage and costs are generally increased, even where integrated circuitry is utilized.

The consumption of power is substantially reduced and the need for a regulated D.C. supply voltage is avoided in the relaxation oscillator of this invention. These improvements are accomplished by applying a reference voltage level in proportion to the D.C. supply voltage at the control electrode of the GTO device and connecting a threshold means between the charge voltage level across the capacitor and the reference voltage level for conducting either positive current when the differential between the reference voltage level and the charge voltage level reaches a positive trigger level or negative current when that differential reaches a negative trigger level. In one preferred embodiment, the reference voltage level is derived through a voltage divider and at least one diac is utilized as the threshold means.

Figure 1:
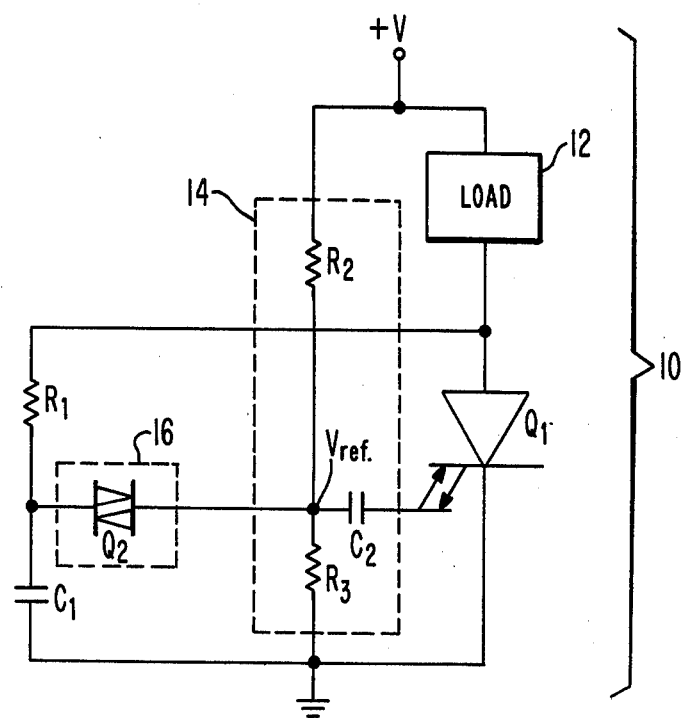
FIG. 1 is a block diagram of the invention and a schematic diagram is also shown therein of one preferred embodiment.

FIG. 1 shows an oscillator circuit 10 of the type wherein a capacitor $C_1$ is recurrently charged from a D.C. supply voltage $+V$ and then discharged through a GTO device $Q_1$ upon reaching a threshold voltage thereacross. $Q_1$ includes an anode, a cathode, and a control electrode or gate. The conductivity of a main conduction path between the anode and cathode of $Q_1$ is selectively controlled by applying positive current through its gate to render that path conductive and by applying negative current through its gate to render that path non-conductive. The main conduction path of $Q_1$ is series connected with a load 12 between $+V$ and ground while a resistor $R_1$ is series connected with $C_1$ between ground and the interconnection of the load 12 with $Q_1$. A bias means 14 is included for applying a reference voltage level $V_{ref}$ to the gate of $Q_1$ in proportion to $+V$. Also included is a threshold means 16 for conducting either positive current to the gate of $Q_1$ when the differential between $V_{ref}$ and the charge voltage level across $C_1$ reaches a positive trigger level or negative current to that gate when the differential reaches a negative trigger level.

$Q_1$ is alternately rendered conductive and non-conductive to change the voltage level across its main conduction path during the operation of the relaxation oscillator 10. When $Q_1$ is non-conductive, $C_1$ is exponentially charged towards $+V$ through $R_1$ and the load 12 until the differential between $V_{ref}$ and the charge voltage level across $C_1$ reaches the positive trigger level of the threshold means 16. Positive current is then applied to the gate of $Q_1$ rendering the main conduction path therethrough conductive. The $C_1$ is exponentially discharged toward ground through $R_1$ until the differential between $V_{ref}$ and the charge voltage level across $C_1$ reaches the negative trigger level of the threshold means 16. Negative current is then applied to the gate of $Q_1$ rendering the main conduction path therethrough non-conductive and $C_1$ is again exponentially charged toward $+V$ during the next cycle of the oscillator 10.

Except for the load 12, the only power consumption in the oscillator 10 while $C_1$ is being charged during each oscillation cycle occurs within the bias means 14. Such power consumption is made very small by comparison to similar prior art oscillators in the preferred embodiments of the bias means 14, as will be discussed later in this specification. Furthermore, the $V_{ref}$ and the charge voltage level across $C_1$ are both proportional to the magnitude of $+V$ and therefore, the differential therebetween at any time in each oscillation cycle will remain substantially constant even though $+V$ may be supplied from an unregulated source with the magnitude thereof fluctuating. Consequently, the frequency of the oscillator 10 remains substantially constant despite fluctuations in $+V$, so long as the values of $R_1$ and $C_1$ remain fixed, and that frequency may be predetermined by fixing the value of either $R_1$ or $C_1$, such as by utilizing a variable resistor or variable capacitor. Asymmetric half-cycles may also be derived during each frequency period of the oscillator 10 by connecting a diode (not shown) across a portion of $R_1$ to change the resistance value thereof during either the charging or discharging period of $C_1$. Furthermore, the magnitude of $V_{ref}$ and/or the positive and negative trigger levels of the threshold means 16 may be adjusted to adjust the frequency of the oscillator 10.

Although many embodiments of the invention are possible in regard to the bias means 14 and the threshold means 16, schematic diagrams for preferred embodiments of these elements are shown in FIG. 1. The bias means 14 includes resistors $R_2$ and $R_3$ which are series connected between $+V$ and ground and a capacitor $C_2$ connected from the gate of $Q_1$ to the interconnection between $R_2$ and $R_3$. The threshold means 16 includes at least one diac $Q_2$ which is connected from the interconnection between $R_2$ and $R_3$ to the interconnection between $R_1$ and $C_1$. $R_2$ and $R_3$ function as a conventional voltage divider to establish the $V_{ref}$ level within the bias means 14 and the resistance values thereof are made very large to limit the current flow therethrough when minimal power consumption is desired in the oscillator 10 while $C_1$ is being charged during each oscillation cycle. Furthermore, $C_2$ provides D.C. isolation at the gate of $Q_1$ to thereby prevent a continual current drain from $+V$, which also lowers the power consumption. As is commonly known in the electronic arts, $Q_2$ functions as a bidirectional avalanche diode which is rendered conductive in each direction by applying a breakdown voltage thereacross of positive or negative polarity respectively, and this bidirectional characteristic is usually symmetrical. Within the threshold means 16, $Q_2$ is selected to have a voltage breakdown characteristic in each direction equal to the positive and negative trigger levels respectively. Consequently, as the charge level across $C_1$ is increased toward +V the differential between that charge voltage level and $V_{ref}$ reaches the positive trigger level of the threshold means 16 and positive current is applied to the gate of $Q_1$, rendering its main conduction path conductive. Then the charge voltage level across $C_1$ is decreased toward ground and the differential between that charge voltage level and $V_{ref}$ reaches the negative trigger level of the threshold means 16, so that negative current is applied to the gate of $Q_1$ rendering its main conduction path non-conductive.

Figure 2:
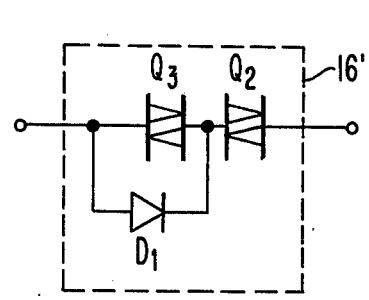
FIG. 2 is a schematic diagram of another embodiment of the threshold means utilized in FIG. 1.

In another preferred embodiment of the bias means 14, $R_2$ and $R_3$ may be replaced by a potentiometer (not shown) having its wiper connected to apply an adjustable level of $V_{ref}$. Other diacs such as $Q_3$, may also be series connected with $Q_2$ in other preferred embodiments of the threshold means 16', as shown in FIG. 2. The positive and negative trigger levels of the threshold means 16' then equals the cumulative voltage breakdown characteristics of the plurality of diacs in each direction of conduction. Furthermore, asymmetric half-cycles may be derived during each frequency period of the oscillator 10 by connecting at least one diode $D_1$ across at least one of the series connected diacs in the threshold means 16', to lower the cumulative voltage breakdown characteristic of the diacs in either direction of conduction through the threshold means 16'.

Figure 3:
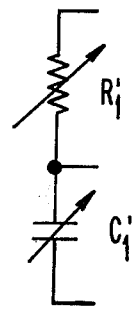
FIG. 3 is a schematic diagram of modifications to the embodiment of FIG. 1.

FIG. 3 shows modifications to the embodiment of FIG. 1 for adjusting the frequency thereof. Variable resistor $R_1'$ or variable capacitor $C_1'$ may be employed in place of resistor $R_1$ or capacitor $C_1$, respectively, to determine the frequency of oscillator 10.

Consequently this invention has been disclosed herein by describing only a few embodiments thereof and numerous changes in the details of construction and the combination or arrangement of parts could be made in these described embodiments without departing from the true scope and spirit of the invention. Therefore, the present invention should be construed as illustrative rather than limiting.

What we claim is:

1. A low power consuming oscillator circuit for maintaining a substantially constant output frequency across a load as a D.C. supply voltage applied to the oscillator circuit fluctuates, comprising:
    a GTO device having a main conduction path and a control electrode, said main conduction path being series connected with the load across the D.C. supply voltage and being rendered conductive or non-conductive respectively when positive or negative current is applied to said control electrode;
    a resistor and a capacitor connected in series across said main conduction path to produce a charge voltage level at a common connection therebetween, said charge voltage level being exponentially varied in response to voltage changes across said main conduction path;
    bias means for producing a reference voltage level at an interconnection thereof in proportion to the D.C. supply voltage, and for applying said reference voltage level to said control electrode; and
    threshold means for conducting either positive or negative current respectively to said control electrode when the differential between said reference voltage level and said charge voltage level reaches positive or negative trigger levels;
    said charge voltage level being recurrently increased toward the D.C. supply voltage level until its differential from said reference voltage level reaches said positive trigger level to render said main conduction path conductive by applying positive current at said control electrode and then being decreased away from the D.C. supply voltage until its differential from said reference voltage level reaches said negative trigger level to render said main conduction path non-conductive by applying negative current at said control electrode, an oscillating voltage level being thereby developed across the load of substantially a constant frequency in accordance with the reference voltage level, the trigger levels of said threshold means and the time constant resulting from said resistor and capacitor combination.

2. The oscillator circuit of claim 1 wherein said threshold means includes a path between said common connection and said interconnection through at least one diac, said oscillation frequency being determined by the number of diacs connected in said path and by the bidirectional voltage breakdown characteristic of those diacs.

3. The oscillator circuit of claim 2 wherein said threshold means further includes at least one diode connected in parallel across at least one but not all of said diacs to derive asymmetric half-cycles during each frequency period.

4. The oscillator circuit of claim 1 wherein said bias means includes a pair of series-connected resistors and a second capacitor, said reference voltage level being developed between said series-connected resistors and being applied to said control electrode through said second capacitor to prevent continual current drain from the D.C. supply voltage.

5. The oscillator circuit of claim 1 wherein the value of said resistor is adjustable to determine said oscillation frequency.

6. The circuit of claim 1 wherein the value of said capacitor is adjustable to determine said oscillation frequency.

* * * * *